(12) United States Patent
Myung et al.

(10) Patent No.: US 8,312,344 B2
(45) Date of Patent: Nov. 13, 2012

(54) COMMUNICATION METHOD AND APPARATUS USING LDPC CODE

(75) Inventors: Se Ho Myung, Suwon-si (KR); Jae Yoei Kim, Suwon-si (KR); Yeon Ju Lim, Seoul (KR); Sung Ryul Yun, Suwon-si (KR); Hak Ju Lee, Icheon Metropolitan (KR)

(73) Assignee: Samsung Electronics Co., Ltd (KR)

( * ) Notice: Subject to any disclaimer, the term of this patent is extended or adjusted under 35 U.S.C. 154(b) by 423 days.

(21) Appl. No.: 12/633,391

(22) Filed: Dec. 8, 2009

(65) Prior Publication Data

US 2010/0153813 A1 Jun. 17, 2010

(30) Foreign Application Priority Data

Dec. 8, 2008 (KR) ........................ 10-2008-0123876

(51) Int. Cl.
*H03M 13/00* (2006.01)
(52) U.S. Cl. ..................................................... 714/752

(58) Field of Classification Search .................. 714/758, 714/752
See application file for complete search history.

(56) References Cited

U.S. PATENT DOCUMENTS

| | | | | |
|---|---|---|---|---|
| 7,480,845 B2* | 1/2009 | Kim et al. | ...................... | 714/752 |
| 7,584,399 B2* | 9/2009 | Kyung et al. | ................... | 714/752 |
| 2006/0036926 A1* | 2/2006 | Hocevar | ........................ | 714/758 |
| 2006/0195761 A1* | 8/2006 | Kim et al. | ...................... | 714/758 |

* cited by examiner

*Primary Examiner* — Philip Guyton
(74) *Attorney, Agent, or Firm* — The Farrell Law Firm, P.C.

(57) ABSTRACT

An encoding method using a Low Density Parity Check (LDPC) matrix having a codeword length of N and an information word length K is provided to improve coding efficiency, and includes generating a first parity bit vector ($p_1$) using the low density parity check matrix, generating a second parity bit vector ($p_2$), performing L-parallel iterative accumulation encoding on the first parity bit vector, and generating a codeword vector $c=(s,p_1,p_2)$ including an information word vector and the first and second parity bit vectors. The communication method and apparatus herein provides an efficient encoding algorithm using the trade-off relationship between a circuit implementation and operation and delay complexities.

8 Claims, 10 Drawing Sheets

FIG . 1

$$H_1 = \begin{bmatrix} 1 & 1 & 1 & 1 & 1 & 0 & 0 \\ 1 & 1 & 0 & 1 & 0 & 1 & 1 & 0 \\ 1 & 1 & 1 & 0 & 0 & 0 & 0 & 0 \\ 1 & 0 & 1 & 1 & 1 & 0 & 0 & 1 \end{bmatrix}$$

FIG. 7

| | $P_{2,1}$ | $P_{2,2}$ | $P_{2,3}$ | ... | $P_{2,M-2}$ | $P_{2,M-1}$ |
|---|---|---|---|---|---|---|
| Row-Permuted Information Part | I | I | 0 | | 0 | 0 |
| | 0 | I | I | ... | 0 | 0 |
| | 0 | 0 | I | | 0 | 0 |
| | 0 | 0 | 0 | ⋱ | I | 0 |
| | | ⋮ | | ⋱ | I | I |
| | Q | 0 | 0 | 0 | 0 | I |

COMMUNICATION METHOD AND APPARATUS USING LDPC CODE

PRIORITY

This application claims priority to an application entitled "COMMUNICATION METHOD AND APPARATUS USING LDPC CODE" filed in the Korean Intellectual Property Office on Dec. 8, 2008 and assigned Serial No. 10-2008-0123876, the contents of which are incorporated herein by reference.

BACKGROUND OF THE INVENTION

1. Field of the Invention

The present invention relates generally to a communication system and, in particular, to a communication method and apparatus for a communication system using Low-Density Parity-Check (LDPC) code to improve coding efficiency using the trade-off relationship between the circuit implementation and operation complexity and the delay complexity determining the performance of an LDPC encoder.

2. Description of the Related Art

In wireless communication systems, link throughput is significantly degraded by factors such as various noises, fading effect, and Inter-Symbol Interference (ISI). In order to fulfill the high data rate and liability requirements of the broadband data transmission systems such as next generation mobile communication systems and digital broadcast systems, it is highly necessary to overcome the noise, fading and ISI problems. For this reason, research has been extensively conducted to find the error-correcting codes that can recover the original codeword more efficiently and thus improve the communication reliability.

Soon after the invention of the LDPC codes by Robert Gallager, these codes were somewhat disregarded due to their implementation complexity surpassing the technology at that time. The discovery of turbo codes by Berrou, Glavieux, and Thitimajshima in 1993, which illustrates a code rate near the Shannon's channel capacity, has directed analytical research toward the performance and characteristics of the turbo code and iterative decoding and graph-based channel encoding. This research caused a return to the study of the LDPC code in the late 1990's, and the LDPC code has been found to achieve information rates very close to the Shannon limit with the iterative decoding based on the sum-product algorithm using a Tanner graph (a special case of a factor graph) representing the LDPC code.

The LDPC code is usually represented by a bipartite graph, and its characteristics can be analyzed using the methods based on the graph theory, algebra, and probability theory. Typically, a graph model of a channel code is useful for describing a code. When information on an encoded bit corresponds to a vertex in a graph and the relation between encoded bits corresponds to an edge (i.e. a line segment), the graph model of the channel code may be considered as a communication network in which vertexes exchange predetermined messages through edges, thereby deriving a natural decoding algorithm. For instance, a decoding algorithm derived from a trellis, which is a type of graph, includes a well-know Viterbi algorithm and a Bahl, Cocke, Jelinek, and Raviv (BCJR) algorithm.

The LDPC code is conventionally defined by a parity-check matrix and can be represented by a bipartite graph, commonly called a Tanner graph, in which vertexes are divided into two different types. The LDPC code is represented by the bipartite graph formed by vertexes called "variable node" and "check node." A variable node corresponds to an encoded bit. However, the conventional LDPC encoding/decoding method suffers from operational complexities and transmission delay. Therefore, an efficient LDPC encoding/decoding method is required.

SUMMARY OF THE INVENTION

The present invention provides an LDPC encoding/decoding method and apparatus for a wireless communication system using an accumulator-based LDPC code that is capable of improving transmission efficiency with the trade-off relationship between implementation and operation complexity and delay complexity.

In accordance with the present invention, an encoding method using an LDPC matrix having a codeword length of N and an information word length K includes generating a first parity bit vector ($p_1$) having the length of L using the low density parity check matrix, generating a second parity bit vector ($p_2$) having the length of N-K-L by performing L-parallel iterative accumulation encoding on the first parity bit vector in unit of vector, and generating a codeword vector $c=(s,\underline{p_1},\underline{p_2})$ including an information word vector and the first and second parity bit vectors.

In accordance with the present invention, a transmission apparatus of a communication system using an LDPC code includes a storage for storing a low density parity check matrix, a low density parity check matrix extractor for extracting the low density parity check matrix from the storage, a low density parity check encoder for encoding a transmission data with a codeword using the low density parity check matrix, a modulator for modulating the coded data into a modulation symbol, and a Radio Frequency (RF) transmitter for transmitting the modulation symbol, wherein the low density parity check encoder generates a first parity bit vector ($p_1$) having the length of L using the low density parity check matrix, generates a second parity bit vector ($p_2$) having the length of N-K-L by performing L-parallel iterative accumulation encoding on the first parity bit vector in unit of vector, and generates a codeword vector $c=(s,\underline{p_1},\underline{p_2})$ including an information word vector and the first and second parity bit vectors.

In accordance with the present invention, a decoding method for a communication system using an LDPC code includes determining an information word sub-matrix corresponding to an information part and a parity sub-matrix corresponding to a parity part of the low density parity check matrix, generating a rearranged low density parity check matrix by placing a $(i \times (N-K)/L+j)^{th}$ column at the $((N-K)-(j+1) \times L+i)^{th}$ column to $0^{th}$ column to $(N-K-1)^{th}$ column of the parity sub-matrix and placing $(i \times (N-K)/L+j)^{th}$ row at the $((N-K)-(j+1) \times L+i)^{th}$ row to the $0^{th}$ row to the $(N-K-1)^{th}$ row of the parity sub-matrix, where L is a divisor of N-K (excluding 1 and N-K), $0 \leq i \leq L-1$, and $0 \leq j \leq (N-K)/L-1$, and decoding with the rearranged low density parity check matrix, In accordance with the present invention, a decoding apparatus for a communication system using an LDPC code includes a parity check matrix determiner for determining a low density parity check matrix used at a transmission apparatus from a received signal, a storage for storing the low density parity check matrix, a low density parity check matrix extractor for extracting the low density parity check matrix from the storage using the information on the low density parity check matrix determined by the parity check matrix determiner, and a low density parity check matrix decoder for decoding the received signal using the extracted low density parity check matrix, wherein the low density parity check matrix extractor comprises a matrix converter for determining a sub-matrix corresponding to an information part and a sub-matrix corresponding to a parity part of the extracted low density parity check matrix of which codeword length is N and information word length K and generating a rearranged low density parity check matrix by placing a $(i \times (N-K)/L+j)^{th}$ column at the $((N-K)-(j+1) \times L+)^{th}$ column to $0^{th}$ column to $(N-K-1)^{th}$ column of the parity sub-matrix and placing $(i \times (N-K)/L+j)^{th}$ row at the $((N-K)-(j+1) \times L+)^{th}$ row to the $0^{th}$ row to the $(N-K-1)^{th}$ row of the parity sub-matrix, where L is a divisor of N−K (excluding 1 and N−K), $0 \leq i \leq L-1$, and $0 \leq j \leq (N-K)/L-1$.

BRIEF DESCRIPTION OF THE DRAWINGS

The above and other objects, features and advantages of the present invention will be more apparent from the following detailed description in conjunction with the accompanying drawings, in which:

FIG. 1 illustrates a parity check matrix of an LDPC code having the codeword length of 8;

FIG. 7 illustrates a relationship between the rearranged parity check matrix of FIG. 6 with parity bits;

DETAILED DESCRIPTION OF THE EMBODIMENTS

Embodiments of the present invention are described with reference to the accompanying drawings in detail. The same reference numbers are used throughout the drawings to refer to the same or like parts. Detailed descriptions of well-known functions and structures incorporated herein may be omitted for the sake of clarity and conciseness.

The terms and words used in the following description and claims are not limited to the dictionary meanings, but, are merely used by the inventor to enable a clear and consistent understanding of the invention. Accordingly, it should be apparent to those skilled in the art that the following description of the embodiments of the present invention are provided for illustration purposes only and not for the purpose of limiting the invention as defined by the appended claims and their equivalents.

Figure 2:
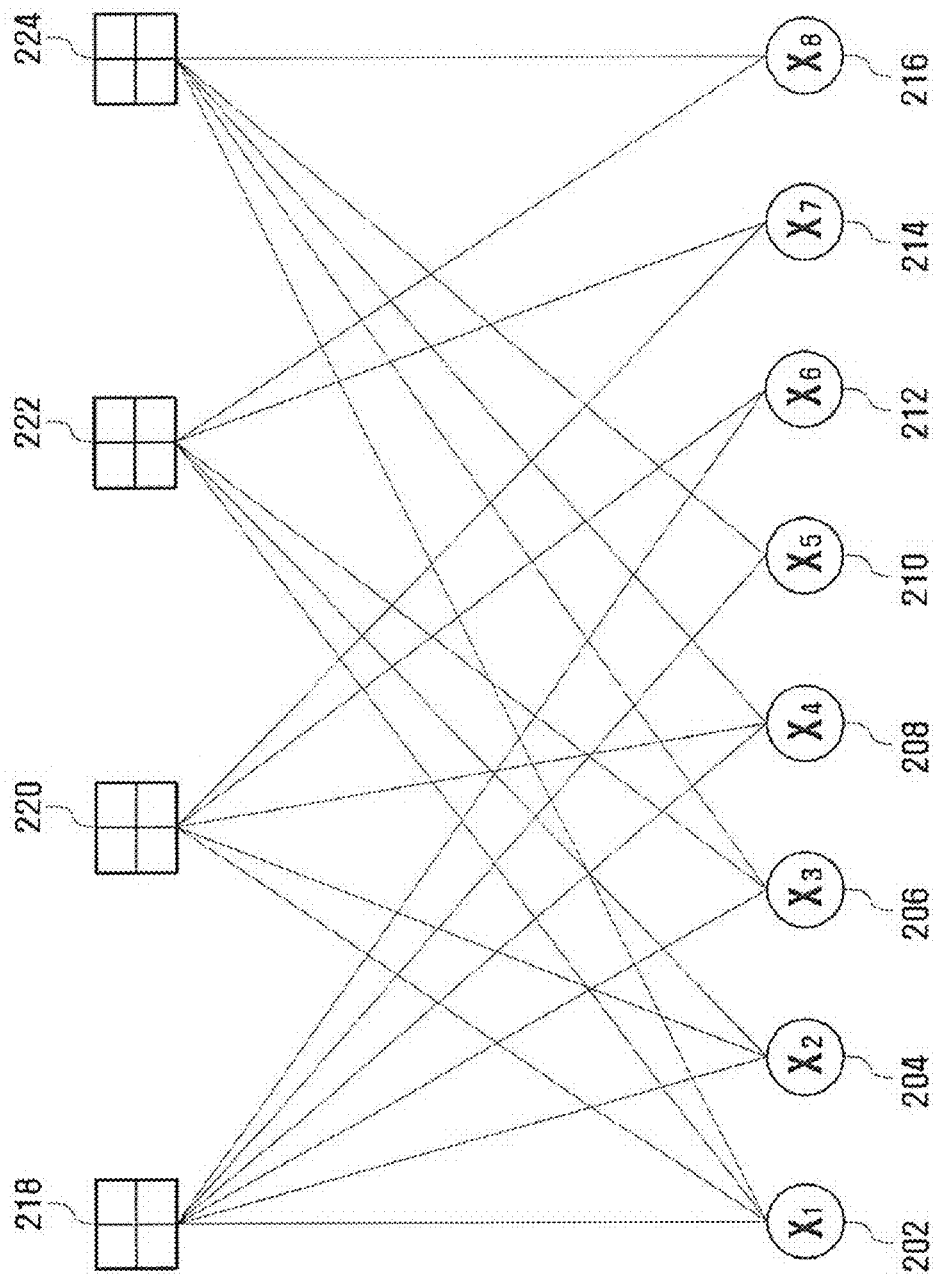
FIG. 2 illustrates a Tanner graph corresponding to the parity check matrix of FIG. 1.

FIG. 1 illustrates a parity check matrix of an LDPC code having the codeword length of 8, and FIG. 2 illustrates a Tanner graph corresponding to the parity check matrix of FIG. 1.

The description of the LDPC code represented by a graph is described with reference to FIGS. 1 and 2.

Referring to FIG. 1, 8 rows of the parity check matrix indicate that the LDPC code generates a codeword having the length of 8, and each column corresponds to the encoded 8 bits.

Referring to FIG. 2, the tanner graph representing the LDPC code has 8 variable nodes $x_1$ 202, $x_2$ 204, $x_3$ 206, $x_4$ 208, $x_5$ 210, $x_6$ 212, $x_7$ 214, and $x_8$ 216; and 4 check nodes 218, 220, 222, and 224. The $i^{th}$ column and $j^{th}$ row of the parity check matrix $H_1$ of the LDPC code correspond to the variable node $x_i$ and the $j^{th}$ check node, respectively. If the element position at the location where the $i^{th}$ column and the $j^{th}$ row of the parity check matrix H1 of the LDPC code is 1, i.e. non-zero, this indicates that there is an edge between the variable node $x_i$ and the $j^{th}$ check node in the Tanner graph as shown in FIG. 2.

The degree of each variable node or check node in the Tanner graph of the LDPC code indicates the number of edges of the node, and the number of edges of the node is equal to the number of non-zero elements on the column or row to which the corresponding element belongs in the parity-check matrix H1 of the LDPC code. Accordingly, in FIG. 2, the degrees of the variable nodes 202, $x_2$ 204, $x_3$ 206, $x_4$ 208, $x_5$ 210, $x_6$ 212, $x_7$ 214, and $x_8$ 216 are 4, 3, 3, 3, 2, 2, 2, and 2, respectively; and the degrees of the check nodes 218, 220, 222, and 224 are 6, 5, 5, and 5. Also, the numbers of nonzero elements of the columns or rows to which the respective elements corresponding to the variable nodes are identically 4, 3, 3, 3, 2, 2, 2, and 2, and the numbers of nonzero elements of the column or row to which the elements corresponding to the check nodes are identically 6, 5, 5, and 5.

It is supposed that the ratio of the number of variable nodes having degree of i to the total number of variable nodes is f, and the ratio of the number of check nodes having degree of j to the total number of check nodes is $g_j$ in order to show the degree distribution of the nodes of the LDPC code, $f_2=4/8$, $f_3=3/8$, $f_4=1/8$, and $f_i=0$ ($i \neq 2, 3, 4$); $g_5=3/4$, $g_6=1/4$, and $g_i=0$ ($j \neq 5, 6$) in FIGS. 1 and 2. If the codeword length of the LDPC code is N, i.e. the number of columns of the parity check matrix) is N and the number of rows is N/2, the density of the nonzero elements in the parity check matrix having the above degree distribution is calculated by Equation (1) as follows:

$$\frac{2f_2N + 3f_3N + 4f_4N}{N \cdot N/2} = \frac{5.25}{N} \quad (1)$$

In Equation (1), if N increases, the density of nonzero elements decreases. Since the density of nonzero elements is inversely proportional to the codeword length of the LDPC code, a large value for N indicates low density of nonzero elements in the LDPC code as its name implies.

The parity check matrix of a normal LDPC code includes an information part and a parity part. The parity check matrix H of an LDPC code can be expressed as shown in the following Equation (2):

$$H = [H_{information} H_{parity}] \quad (2)$$

where $H_{information}$ is the information sub-matrix, and $H_{parity}$ is a parity sub-matrix.

The final step of the encoding process using the parity check matrix of Equation (2) is determining a parity bit vector $\underline{p}$ satisfying the following Equation (3) from a given information vector $\underline{s}$.

$$H \cdot \underline{c}^T = [H_{information} H_{parity}] \cdot \begin{bmatrix} \underline{s} \\ \underline{p} \end{bmatrix} \quad (3)$$

$$= H_{information} \cdot \underline{s}^T + H_{parity} \cdot \underline{p}^T$$

$$= 0$$

Since the information $\underline{s}$ and $H_{information}$ are given in Equation (3), $H_{information} \cdot \underline{s}^T$ is deterministic. Expressing the result of $H_{information} \cdot \underline{s}^T$ as vector $\underline{v}^T$, the LDPC coding process can be defined as a process to find $\underline{p}$ satisfying Equation (4):

$$H_{parity} \cdot \underline{p}^T = \underline{v}^T \quad (4)$$

The encoding complexity of the LDPC code is determined depending on the structure of $H_{parity}$ of Equation (4). Accordingly, the LDPC encoding is often performed with the $H_{parity}$ having a restricted structure to reduce the encoding complexity of the LDPC code.

In order to describe the encoding process using the LDPC code having a normal form of $H_{parity}$, the parity check matrix H is decomposed into $H_{information}$ and $H_{parity}$ as shown in Equation (5):

$$H = \begin{bmatrix} A & B & T \\ C & D & E \end{bmatrix}, H_{information} = \begin{bmatrix} A \\ C \end{bmatrix}, H_{parity} = \begin{bmatrix} B & T \\ D & E \end{bmatrix} \quad (5)$$

where T is a lower triangular matrix. When the parity check matrix of the LDPC code is formed as shown in Equation (5), the encoding process is performed as shown in the following Formula 1, including Steps 1-5 and Equation (6):

Formula 1

In step 1, calculate $A \cdot \underline{s}^T$ and $C \cdot \underline{s}^T$ to the information vector $\underline{s}$;

In step 2, calculate $ET^{-1} A \cdot \underline{s}^T$;

In step 3, calculate $\underline{p}_1$ as follows:

$$\underline{p}_1^T = (ET^{-1}B + D)^{-1} \cdot (ET^{-1} A \cdot \underline{s}^T + C \cdot \underline{s}^T);$$

In step 4, calculate $\underline{p}_2$ as shown in Equation (6):

$$T\underline{p}_2^T = A \cdot \underline{s}^T + B\underline{p}_1^T \quad (6)$$

and in step 5, determine the encoded LDPC codeword as $\underline{c} = (\underline{s}, \underline{p}_1, \underline{p}_2)$ Step 3 is for calculating an inverse matrix of $ET^{-1}B + D$ in the encoding process. Typically, the LDPC code has a parity check matrix in which the density of nonzero elements is low. However, the number of nonzero elements may greatly increase in the inverse matrix of $ET^{-1}B + D$. Accordingly, step 3 influences the increase of the coding complexity in the LDPC encoding process. Particularly, as the size of $ET^{-1}B + D$ increases, the coding complexity increases in square order of 2. For this reason, the number of nonzero elements in the inverse matrix of $ET^{-1}B + D$ is prevented from increasing, to reducing the coding complexity.

Figure 3:
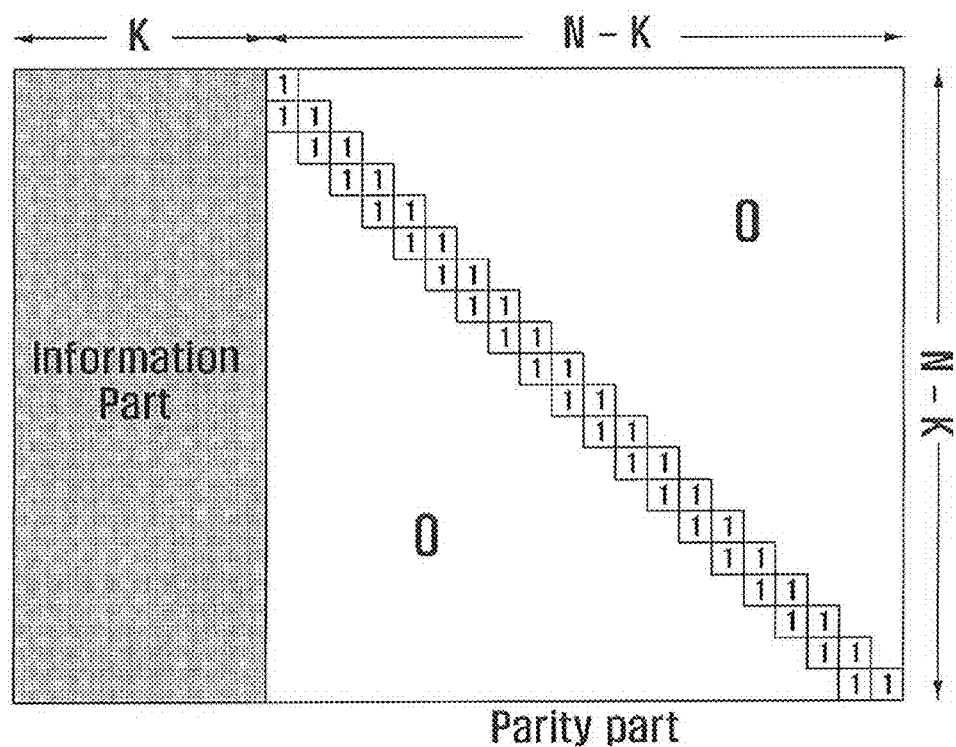
FIG. 3 illustrates a structure of a parity check matrix of an accumulator-based LDPC code.
Figure 4:
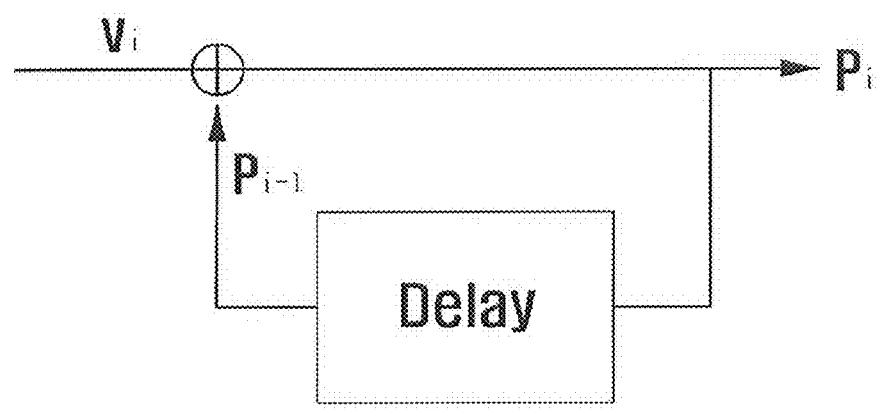
FIG. 4 illustrates a configuration of an accumulator-based LDPC encoder.

FIG. 3 illustrates a structure of a parity check matrix of an accumulator-based LDPC code, and FIG. 4 illustrates a configuration of an accumulator-based LDPC encoder.

In an extreme example to reduce the coding complexity of the LDPC code, the parity check matrix as shown in FIG. 3 has been proposed by Divsalar, Jin, and McEliece in 1998. In FIG. 3, K is the information word length, and N is the codeword length.

As shown in FIG. 3, since the entire parity part of the parity check matrix has a lower triangular matrix structure, step 3 is not necessary. Thus, the entire parity bits can be obtained through step 4. This type of LDPC code is called a repeat-accumulate code because the parity bits are obtained through the accumulation operation as shown below in Equation (7). In order to simplify the explanation, the parity bit vector of Equation (4) is expressed as $\underline{p} = (p_0, p_1, \ldots, p_{N-K-1})$ and vector element of $\underline{v}$ is expressed as $\underline{v} = (v_0, v_1, \ldots, v_{N-K-1})$.

$$p_0 = v_0$$

$$p_i = v_i \oplus p_{i-1}, i = 1, 2, \ldots, H-K-1 \quad (7)$$

The repeat-accumulate code is a branch of the LDPC code; however, it has a parity check matrix with a restrict pattern in order to perform linear time encoding with a simple circuit implemented by Equation (7) as shown in FIG. 4. Similar accumulator-based LDPC codes have been proposed in view of the advantages of the repeat-accumulate code.

The accumulator-based encoding process generates one parity bit at a time. Thus, in order to generate a parity bit $p_{i+1}$, a parity bit $p_i$ must be generated at the previous stage. Accordingly, assuming that the parity bit $p_0$ is given, the encoding process using Equation (7) must be repeated N-K-1 times to generate all of the parity bits. The complexity of the LDPC encoder is determined depending on the delay complexity as well as the circuit implementation and operation complexities. Some communication systems may ignore the delay but require low circuit implementation and operation complexity. In other communication systems, however, the delay time is the more important criterion to determine the system performance than the circuit implementation and operation complexities. Accordingly, it can be very useful to exploit the trade-off relationship between the implementation and operation complexities and the delay complexity to improve the encoding efficiency of the communication system using the accumulator-based LDPC code.

For simplicity purpose, the sub-matrix corresponding to the parity part of the parity check matrix of which the codeword length is N and the information word length is K is restructured with the following Rules 1 and 2. It is noted that the length of parity bits is N-K.

Rule 1

In the sub-matrix corresponding to the parity part of the parity check matrix, the columns corresponding to $0^{th}$ parity bit to $(N-K-1)^{th}$ parity bit are rearranged such that the $(i \times (N-K)/L+j)^{th}$ column is placed at the $((N-K)-(j+1) \times L+i)^{th}$ column. Here, L is a preset integer ($0 \leq L \leq L-1$, $0 \leq j \leq (N-K)/L-1$).

Rule 2

The $0^{th}$ row to $(N-K-1)^{th}$ row of the parity check matrix are rearranged such that the $(i \times (N-K)/L+j)^{th}$ row is placed at the $((N-K)-(j+1) \times L+i)^{th}$ row. Here, L is a preset integer ($0 \leq L \leq L-1$, $0 \leq j \leq (N-K)/L-1$).

Figure 5:
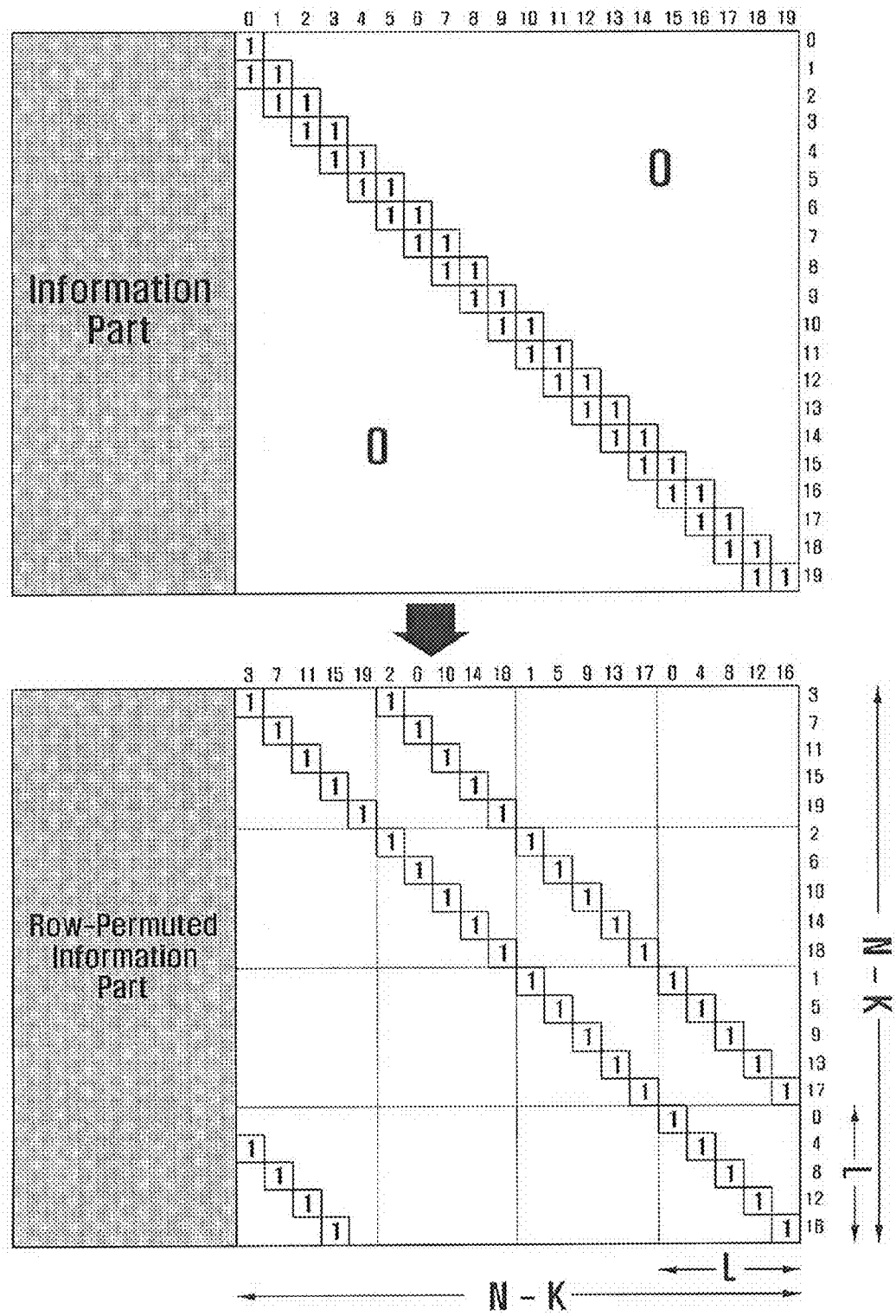
FIG. 5 illustrates a principle of the rearrangement of the parity part of the parity check matrix of FIG. 3 according to the predetermined rules.

FIG. 5 illustrates a principle of the rearrangement of the parity part of the parity check matrix of FIG. 3 according to Rules 1 and 2.

As shown in FIG. 5, as a result of the rearrangement of the parity part of the parity check matrix of FIG. 3, the sub-matrix corresponding to the parity part of the parity check matrix is structured in a regular pattern.

Figure 6:
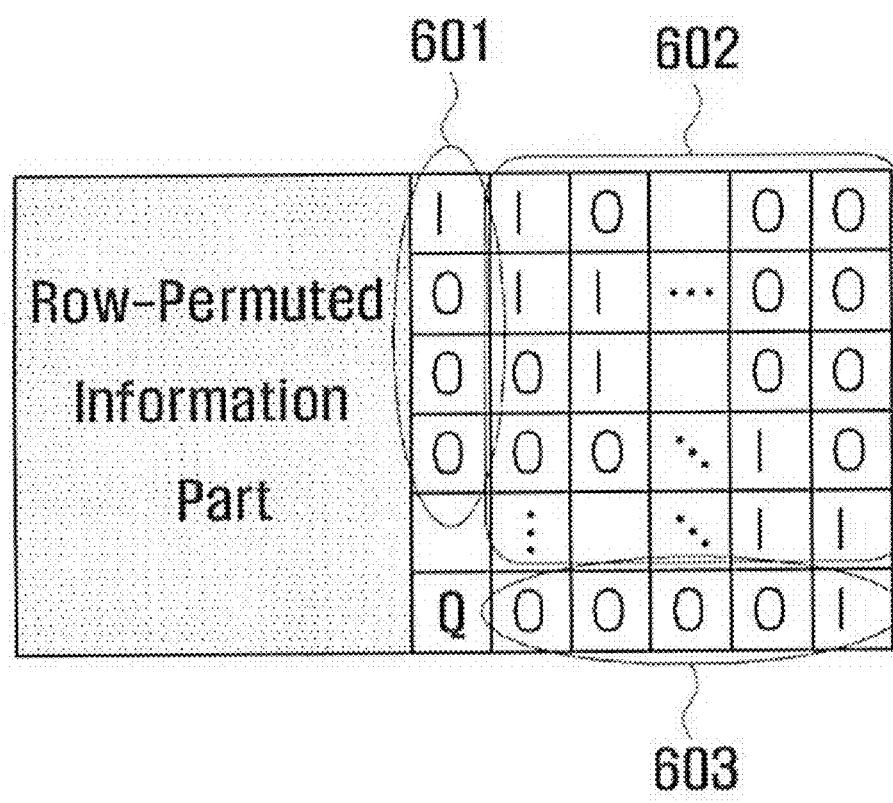
FIG. 6 illustrates a normalized form of the rearranged parity check matrix of FIG. 5.

FIG. 6 illustrates a normalized form of the rearranged parity check matrix of FIG. 5.

In FIG. 6, I is an identity matrix of size L×L, and Q is a matrix of size L×L as shown in the following matrix:

$$Q = \begin{bmatrix} 0 & 0 & & 0 & 0 \\ 1 & 0 & \cdots & 0 & 0 \\ 0 & 1 & & & 0 \\ \vdots & & \ddots & \vdots & 0 \\ 0 & 0 & \cdots & 1 & 0 \end{bmatrix}$$

The encoding step represented by the above-described steps related to and including Equation (6) is applied to the parity check matrix of FIG. 6. Since steps 1, 2, 4, and 5 are not changed, only step 3 is analyzed. Here, B, T, and E correspond to reference numerals 601, 602, and 603.

In Formula 1, D=Q and the result of $ET^{-1}B+D$ at step 3 is represented by Equation (8) as follows:

$$ET^{-1}B + D = I + Q = \begin{bmatrix} 1 & 0 & 0 & 0 & 0 & 0 \\ 1 & 1 & 0 & 0 & 0 & 0 \\ 0 & 1 & 1 & 0 & 0 & 0 \\ 0 & 0 & \ddots & \ddots & 0 & 0 \\ 0 & 0 & 0 & 1 & 1 & 0 \\ 0 & 0 & 0 & 0 & 1 & 1 \end{bmatrix} \quad (8)$$

It is noted that $ET^{-1}B+D$ has a size L×L.

At step 3 of Formula (I), there exists a stage to obtain and multiply the inverse matrix of $ET^{-1}B+D$, i.e. the inverse matrix of I+Q. The inverse matrix of I+Q of Equation (8) is represented as Equation (9) as follows:

$$(I+Q)^{-1} = \begin{bmatrix} 1 & 0 & 0 & 0 & 0 \\ 1 & 1 & 0 & 0 & 0 \\ 1 & 1 & 1 & 0 & 0 \\ 1 & 1 & \vdots & \ddots & 0 \\ 1 & 1 & 1 & 1 & 1 \end{bmatrix} \quad (9)$$

The encoding may be performed through the multiplication operation using the result of Equation (9) at step 3 of Formula (I). As shown in Equation (9), however, the inverse matrix of I+Q includes L(L+1)/2 nonzero elements, i.e. "1", and the number of "1"s increases in square order of L. Accordingly, a shortcoming exists wherein operation complexity increases as the I+Q size increases. However, the operation complexity can be efficiently reduced by performing the encoding process with Equation (10) at step 3 of Formula 1, as follows:

$$(ET^{-1}B+D)\cdot \underline{p}_1^T = (I+Q)\cdot p_1^T = ET^{-1}A\underline{s}^T + C\underline{s}^T \quad (10)$$

Equation (10) can be rewritten by substituting $H_{I+Q}$ for I+Q, and vector $\underline{w}^T$ for $ET^{-1}A\underline{s}^T + C\underline{s}^T$ as shown in Equation (11):

$$H_{I+Q}\underline{p}_1^T = \underline{w}^T \quad (11)$$

Equation (11) is similar to Equation (4), and $H_{I+Q}$ of Equation (11) is identical with the parity part of the parity check matrix of FIG. 3. Accordingly, the parity bit generation process using Equation (11) becomes identical with that using Equation (7), and can be implemented efficiently with the accumulator of FIG. 4. When Equation (11) is implemented with the circuit of FIG. 4 as shown in Equation (7), it is possible to obtain the parity bit vector $\underline{p}=(p_0, p_1, \ldots, p_{L-1})$ of length L after L stages.

A process for obtaining the remainder of the parity bit vector $\underline{p}_2$ at step 4 of Formula 1 will be described hereinafter. It is noted that the length of $\underline{p}_2$ is N−K−L. For the sake of conciseness, the vector $\underline{p}_2$ is rewritten as (N−K−L)/L partial vectors $\underline{p}_{2j}$ of length L as shown in Equation (12):

$$\underline{p} = (p_L, p_{L+1}, \ldots, p_{N-K-1}) = (\underline{p}_{2,1}, \underline{p}_{2,2}, \ldots, \underline{p}_{2,M-1})$$

$$\underline{p}_{2,i} = (p_{i\times L}, p_{i\times L+1}, \ldots, p_{i\times L+L-1}), i=1, 2, \ldots, M-1 \quad (12)$$

where M=(N−K)/L.

FIG. 7 illustrates a relationship between the rearranged parity check matrix of FIG. 6 with parity bits, to which the present invention is applied.

Referring to FIG. 7, the parity bits in a specific partial vector $\underline{p}_{2,i} = (p_{i\times L}, p_{i\times L+1}, \ldots, p_{i\times L+L-1})$ to i=1, 2, ..., M−1 have no direct relationship in the encoding process. For instance, it is unnecessary to calculate any parity bit within the $\underline{p}_{2,i}$ as well as previous parity bit $p_{i\times L+j-1}$ in order to obtain a specific parity bit $p_{i\times L+j}$ (0≤j≤L). All of the parity bits constituting $\underline{p}_{2,i}$ to i=1, 2, ..., M−1 can be obtained independently and simultaneously.

In FIG. 7, the result of $p_{(i-1)\times L+j}$ is required in order to obtain $p_{i\times L+j}$ (0≤j≤L). In other words, the result of the partial parity bit vector $\underline{p}_{2,(i-1)}$ of the previous stage is required to obtain $\underline{p}_{2,i}$. Accordingly, if the p entire parity bit vector is expressed as partial parity bit vectors such as $\underline{p}=(\underline{p}_1, \underline{p}_{2,1}, \underline{p}_{2,2}, \ldots, \underline{p}_{M-1})$, the parity bit generation process can be expressed as shown in Equation (13). For the sake of conciseness, the vector $\underline{v} = (v_0, v_1, \ldots, v_{N-K-1})$ of Equation (4) is expressed as a partial vector of length L similar to the parity bit vector.

If $\underline{v} = (\underline{v}_0, \underline{v}_1, \ldots, \underline{v}_M), \underline{v}_i = (v_{(i-1)\times L}, v_{(i-1)\times L+1}, \ldots, v_{i-1\times L+L-1}), i=1, 2, \ldots, M-1,$ $\underline{p}_{2,1} = \underline{v}_2 \oplus \underline{p}_1,$ $\underline{p}_{2,i} = \underline{v}_{i+1} \oplus \underline{p}_{2,i-1}, i=2, 3, \ldots, M-1 \quad (13)$ It is noted that in Equation (7), the parity bits are generated in unit of bit, whereas in Equation (13) the parity bits are generated in unit of vector of length L.

In order to describe the differences between the parity bit generation processes of Equation (7) and Equation (13), the numbers of operations and iterative stages are generally compared.

When using Equation (7), N−K−1 ⊕ operations are performed during the N−K sequential stages to obtain N−K parity bits. In contrast, in Equation (13), N−K−L ⊕ operations are performed during (N−K)/L−1 sequential stages. Adding N−1 ⊕ operations including L sequential ⊕ operations for obtaining $\underline{p}_1 = (p_0, p_1, \ldots, p_{L-1})$, total N−K−1 ⊕ operations are performed during the (N−K)/L+L−1 sequential stages. Table 1 shows the comparison results.

TABLE 1

| | Conventional Coding Method | Present Invention |
|---|---|---|
| # of operations | N − K − 1 | N − K − 1 |
| # of stages | N − K | (N − K)/L + L − 1 |

As shown in Table 1, the two methods are identical in number of operations. However, if L is equal to or greater than 2, the number of stages of the method according to the present invention is less than that of the conventional method. Particularly, as L approaches $\sqrt{(N-K)}$, the number of stages approaches the minimum value in the method according to the present invention.

Since the LDPC encoder must be designed in consideration of the circuit implementation, operation and delay complexities, the encoding algorithm disclosed in the present invention reduces the delay complexity by reducing the encoding stages with adjustment of L.

In implementation, since N–K has a value of at least several hundred thousand, the large number of iterative stages may cause a significant problem in any communication system. Since the encoding method according to the present invention can reduce these iterative stages by adjusting the value L, it is possible to significantly reduce the encoding delay. However, if the value L increases too much, it can be difficult to simultaneously implement the parallel processing circuit for calculating the vectors using Equation (13). Accordingly, it is preferred to select the value of L in consideration of both the circuit implementation and delay complexities in adaptation with the constraints of the communication system and to perform encoding through the above-described process. Also, the implementation complexity is decreased in view of a reduction in the processing steps.

For reference, if the encoding process is performed with the parity check matrix of FIG. 5 obtained by rearranging the parity check matrix of FIG. 3, the order of the parity bits is changed, requiring the receiver to know the Rules 1 and 2.

Figure 8:
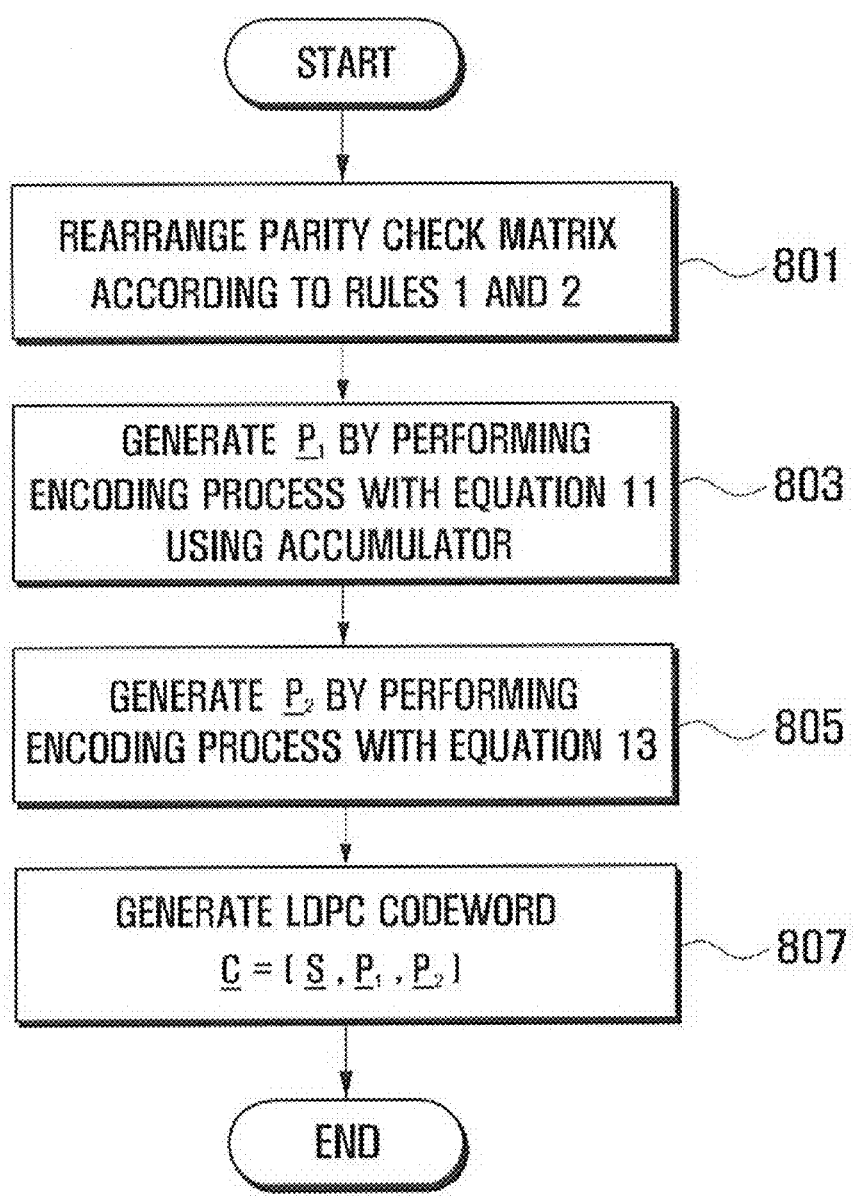
FIG. 8 illustrates an LDPC encoding method using an LDPC encoding algorithm according to the present invention.

FIG. 8 illustrates an LDPC encoding method using an LDPC encoding algorithm according to the present invention.

Referring to FIG. 8, the transmitter rearranges the parity check matrix of FIG. 3 according to the Rules 1 and 2 in step 801. The transmitter generates a first parity bit vector $\underline{p}_1$ by performing the encoding process with Equation (11) using an accumulator in step 803.

The transmitter generates a second parity bit vector $\underline{p}_2$ by performing the iterative accumulation encoding process with Equation (13) based on the result obtained at step 803, in step 805. The transmitter generates an LDPC codeword $\overline{c}=(\overline{s},\underline{p}_1,\underline{p}_2)$ composed of an information word vector $\overline{s}$, the first parity bit vector $\underline{p}_1$, and the second parity bit vector $\underline{p}_2$.

Figure 9:
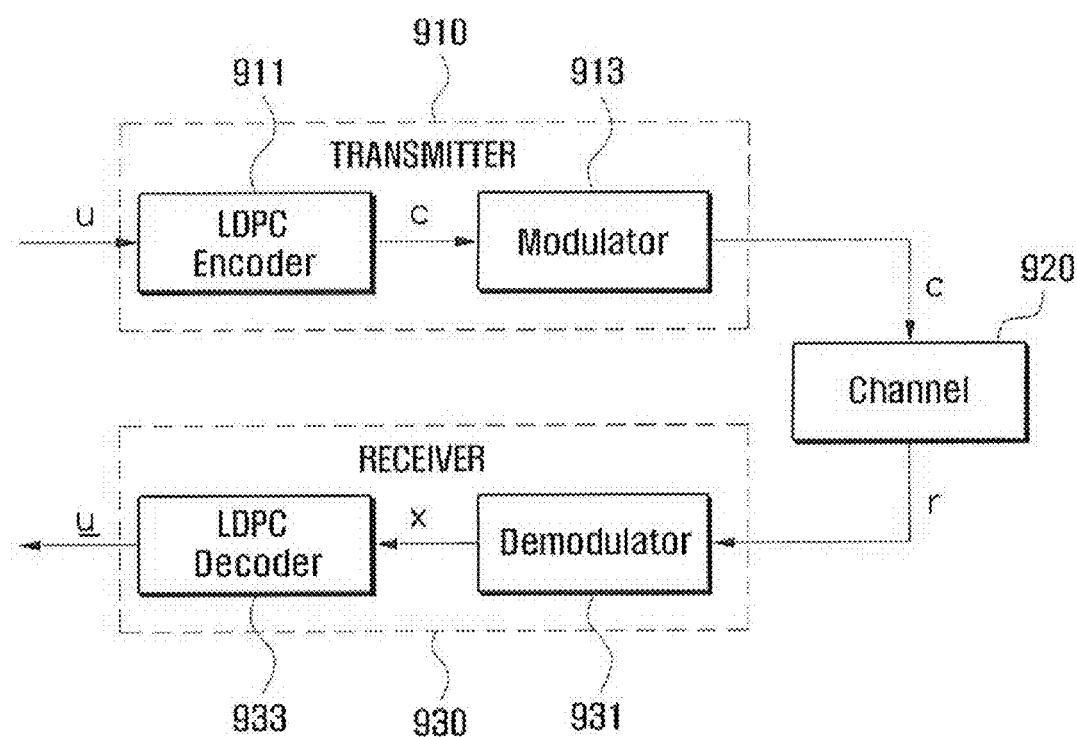
FIG. 9 illustrates a configuration of a communication system using an LDPC code according to the present invention.

FIG. 9 illustrates a configuration of a communication system using an LDPC code according to the present invention.

As shown in FIG. 9, the communication system includes a transmitter 910 and a receiver 930.

The transmitter 910 includes an LDPC encoder 911 for encoding an input message u and a modulator 913 for modulating the coded message and transmits the modulated message through a channel 920. The receiver 930 includes a demodulator 931 for demodulating the modulated message received through the channel 920 and an LDPC decoder 933 for decoding the modulated message into the estimated original message u.

Figure 10:
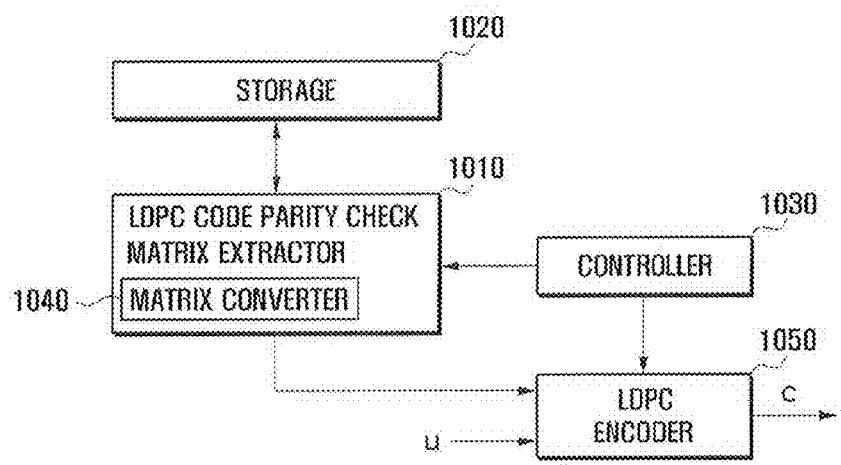
FIG. 10 illustrates a configuration of a transmitter in a communication system using an LDPC encoding algorithm according to the present invention.

FIG. 10 illustrates a configuration of a transmitter in a communication system using an LDPC encoding algorithm according to the present invention.

As shown in FIG. 10, the transmitter includes a LDPC code parity check matrix extractor 1010, a storage 1020, a controller 1030, and an LDPC encoder 1050. The storage 1020 stores an LDPC code parity check matrix, which is a normal parity check matrix or is obtained by rearranging the normal parity check matrix according to Rules 1 and 2.

The LDPC code parity check matrix extractor extracts the LDPC code parity check matrix in consideration of the system requirements, i.e. the size of the parity check matrix and whether the parity check matrix is rearranged, from the storage 1020. The LDPC code parity check matrix extractor 1010 can extract the rearranged parity check matrix from the storage 1020 or rearrange the normal parity check matrix read from the storage 1010 by means of a matrix converter 1040 according to Rules 1 and 2.

The controller 1030 determines a parity check matrix appropriate for the coding rate, the codeword length, and/or the information word length in consideration of the system requirements. The LDPC encoder 1050 encodes the transmit data based on the information of the LDPC code parity check matrix extracted by the LDPC code parity check matrix extractor 1010 under the control of the controller 1030.

Figure 11:
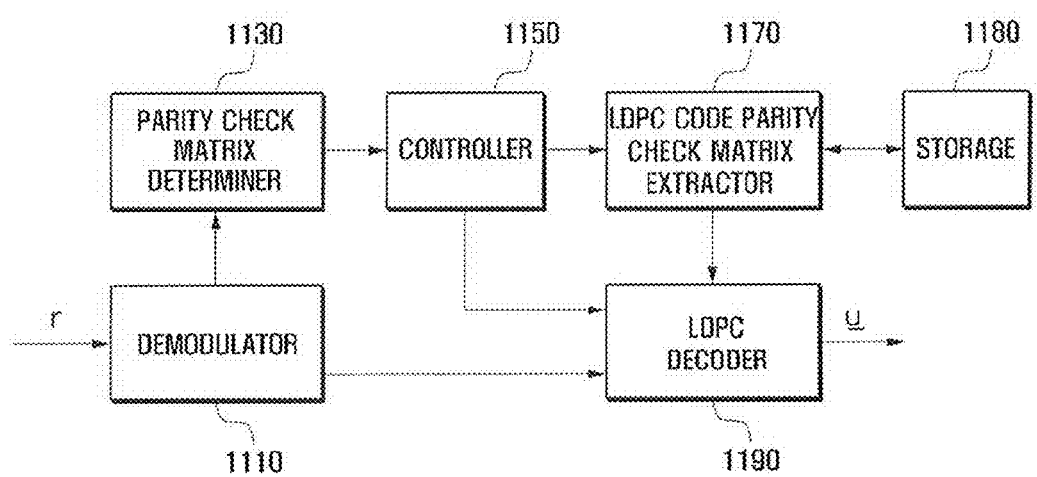
FIG. 11 illustrates a configuration of a receiver in an communication system using an LDPC encoding algorithm according to the present invention.

FIG. 11 illustrates a configuration of a receiver in a communication system using an LDPC encoding algorithm according to the present invention.

As shown in FIG. 11, the receiver includes a demodulator 1110, a parity check matrix determiner 1130, a controller 1150, a LDPC code parity check matrix extractor 1170, a storage 1180, and an LDPC decoder 1190.

The demodulator 1110 demodulates a signal received through a radio channel and outputs the demodulated signal to the parity check matrix determiner 1130 and the LDPC decoder 1190.

The parity check matrix determiner 1130 determines the parity check matrix used in the system from the demodulated signal. The parity check matrix determiner 1130 can determine whether the parity check matrix is rearranged.

The controller 1150 receives the information on the parity check matrix determined by the parity check matrix determiner 1030 and provides the parity check matrix information to the LDPC code parity check matrix extractor 1170 and the LDPC decoder 1190.

The storage 1180 stores the LDPC code parity check matrix, which is a normal parity check matrix or is obtained by rearranging the normal parity check matrix according to Rules 1 and 2.

The LDPC code parity check matrix extractor 1170 extracts the LDPC code parity check matrix from the storage 1180 under the control of the controller 1150 and provides the extracted LDPC code parity check matrix to the LDPC decoder 1190.

The LDPC code parity check matrix extractor 1170 can extract the rearranged parity check matrix (as shown in FIG. 5) from the storage 1180 or rearrange the normal parity check matrix (as shown in FIG. 3) read from the storage 1180 according to Rules 1 and 2.

The LDPC decoder 1190 decodes the signal output from the demodulator 1110 based on the LDPC code parity check matrix information provided by the LDPC code parity check matrix extractor 1170 under the control of the controller 1150.

When the transmitter and the receiver share the information on the structure of the parity check matrix, the parity check matrix determiner 1130, the controller, and the LDPC code parity check matrix extractor 1170 may be omitted or simplified.

Figure 12:
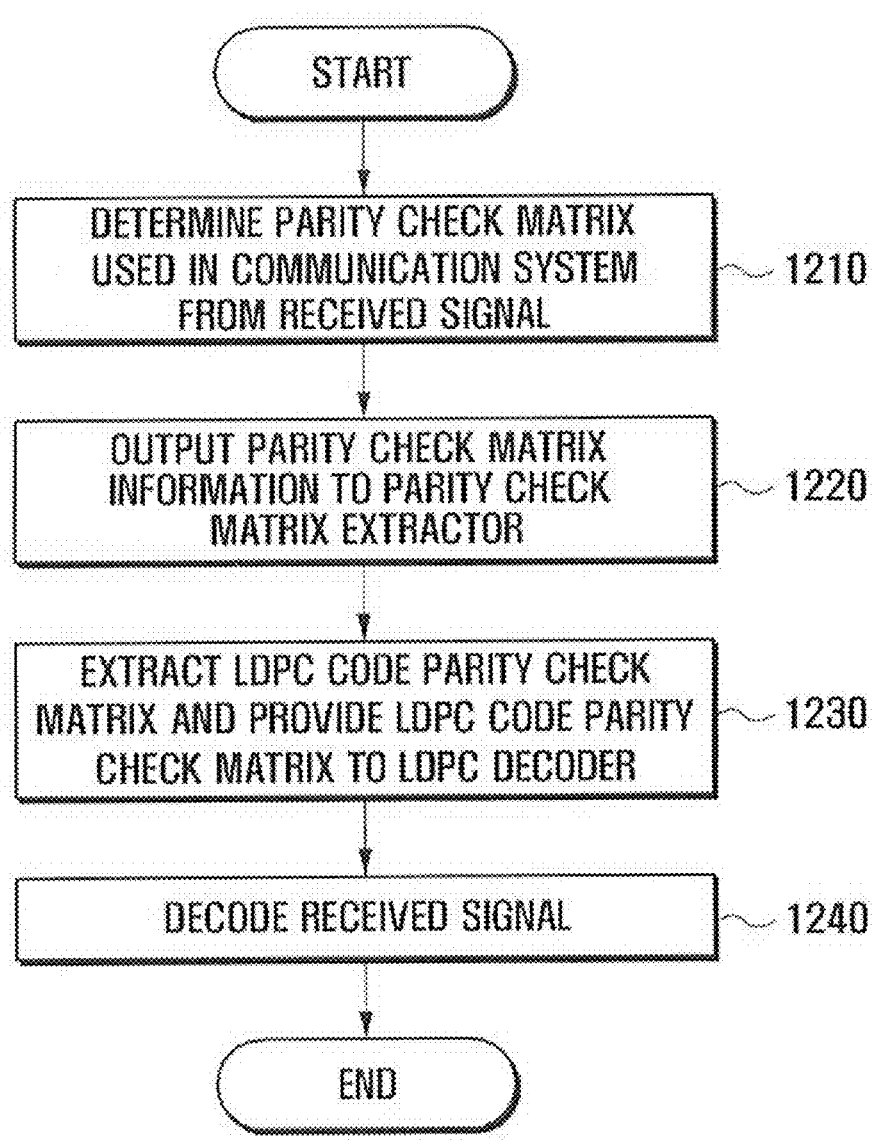
FIG. 12 illustrates an LDPC decoding method using an LDPC decoding algorithm according to the present invention.

FIG. 12 illustrates an LDPC decoding method using an LDPC decoding algorithm according to the present invention.

Referring to FIG. 12, the receiver determines the parity check matrix used in the communication system from a signal received through a radio channel in step 1210. The receiver outputs the parity check matrix information to the parity check matrix extractor in step 1220. The parity check matrix extractor extracts the LDPC code parity check matrix satisfying the system requirements and provides the LDPC code parity check matrix to the LDPC decoder in step 1230. The LDPC decoder decodes the received signal based with the LDPC code parity check matrix provided by the parity check matrix extractor in step 1240.

As described above, the communication method and apparatus using the LDPC code is capable of selecting an encoder in adaptation to the communication system with an efficient encoding algorithm using the trade-off relationship between a circuit implementation and operation and delay complexities.

Although embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An encoding method of transmission apparatus using a Low Density Parity Check (LDPC) matrix having a codeword length of N and an information word length K, the method comprising:
generating, by the transmission apparatus, a first parity bit vector ($\underline{p}_1$) having a length of L using the low density parity check matrix;
generating, by the transmission apparatus, a second parity bit vector ($\underline{p}_2$) having a length of N-K-L by performing L-parallel iterative accumulation encoding on the first parity bit vector; and
generating, by the transmission apparatus, a codeword vector $\underline{c}=(\underline{s}, \underline{p}_1, \underline{p}_2)$ including an information word vector (s) and the first and second parity bit vectors.

2. The encoding method of claim 1, further comprising:
determining an information word sub-matrix corresponding to an information part and a parity sub-matrix corresponding to a parity part of the low density parity check matrix; and
generating a rearranged low density parity check matrix by placing a $(i \times (N-K)/L+j)^{th}$ column at an $((N-K)-(j+1) \times L+i)^{th}$ column to $0^{th}$ column to $(N-K-1)^{th}$ column of the parity sub-matrix and placing $(i \times (N-K)/L+j)^{th}$ row at an $((N-K)-(j+1) \times L+i)^{th}$ row to a $0^{th}$ row to an $(N-K-1)^{th}$ row of the parity sub-matrix, where L is a divisor of N-K (excluding 1 and N-K), $0 \leq i \leq L-1$, and $0 \leq j \leq (N-K)/L-1$.

3. The encoding method of claim 2, wherein generating the second parity bit vector ($\underline{p}_2$) comprises:
dividing the second parity vector ($\underline{p}_2$) into partial vectors $\underline{p}_{2j}$ of length L (i=1, 2, ..., (N-K)/L); and
performing the parallel iterative accumulation encoding in units of vector using the partial vector $\underline{p}_{2j}$.

4. A transmission apparatus of a communication system using a Low Density Parity Check (LDPC) code, comprising:
a storage for storing a low density parity check matrix;
a low density parity check matrix extractor for extracting the low density parity check matrix from the storage;
a low density parity check encoder for encoding transmission data with a codeword using the low density parity check matrix;
a modulator for modulating the coded data into a modulation symbol; and
a Radio Frequency (RF) transmitter for transmitting the modulation symbol,
wherein the low density parity check encoder generates a first parity bit vector ($\underline{p}_1$) having a length of L using the low density parity check matrix, generates a second parity bit vector ($\underline{p}_2$) having a length of N-K-L by performing L-parallel iterative accumulation encoding on the first parity bit vector, and generates a codeword vector $\underline{c}=(\underline{s}, \underline{p}_1, \underline{p}_2)$ including an information word vector ($\underline{s}$) and the first and second parity bit vectors,
wherein N is a codeword length of the low density parity check matrix and K is an information word length of the low density parity check matrix.

5. The transmission apparatus of claim 4, wherein the low density parity check matrix extractor includes a matrix converter for determining a sub-matrix corresponding to an information part and a sub-matrix corresponding to a parity part of the extracted low density parity check matrix of which codeword length is N and information word length K and generating a rearranged low density parity check matrix by placing an $(i \times (N-K)/L+j)^{th}$ column at an $((N-K)-(j+1) \times L+i)^{th}$ column to $0^{th}$ column to $(N-K-1)^{th}$ column of the parity sub-matrix and placing an $(i \times (N-K)/L+j)^{th}$ row at the $((N-K)-(j+1) \times L+i)^{th}$ row to a 0th row to an $(N-K-1)^{th}$ row of the parity sub-matrix, where L is a divisor of N-K excluding 1 and N-K, $0 \leq i \leq L-1$, and $0 \leq j \leq (N-K)/L-1$.

6. The transmission apparatus of claim 5, wherein the low density parity check encoder generates a second parity bit vector ($\underline{p}_2$) by dividing the second parity vector ($\underline{p}_2$) into partial vectors $\underline{p}_{2j}$ of length L (i=1, 2, ..., (N-K)/L) and performs the parallel iterative accumulation encoding in units of vector using the partial vector $\underline{p}_{2j}$.

7. A decoding method for a communication system using a Low Density Parity Check (LDPC) code, comprising:
determining an information word sub-matrix corresponding to an information part and a parity sub-matrix corresponding to a parity part of the low density parity check matrix;
generating a rearranged low density parity check matrix by placing an $(i \times (N-K)/L+j)^{th}$ column at an $((N-K)-(j+1) \times L+i)^{th}$ column to a $0^{th}$ column to an $(N-K-1)^{th}$ column of the parity sub-matrix and placing an $(i \times (N-K)/L+j)^{th}$ row at an $((N-K)-(j+1) \times L+i)^{th}$ row to a $0^{th}$ row to an $(N-K-1)^{th}$ row of the parity sub-matrix, where L is a vector length and is a divisor of N-K excluding 1 and N-K, $0 \leq i \leq L-1$, and $0 \leq i \leq (N-K)/L-1$, wherein N is a codeword length of the low density parity check matrix and K is an information word length of the low density parity check matrix; and
decoding a received signal with the rearranged low density parity check matrix.

8. A decoding apparatus for a communication system using a Low Density Parity Check (LDPC) code, comprising:
a parity check matrix determiner for determining a low density parity check matrix used at a transmission apparatus from a received signal;
a storage for storing the low density parity check matrix;
a low density parity check matrix extractor for extracting the low density parity check matrix from the storage using the information on the low density parity check matrix determined by the parity check matrix determiner; and
a low density parity check matrix decoder for decoding the received signal using the extracted low density parity check matrix, wherein the low density parity check matrix extractor comprises a matrix converter for determining a sub-matrix corresponding to an information part and a sub-matrix corresponding to a parity part of the extracted low density parity check matrix of which a codeword length is N and an information word length is K, and generating a rearranged low density parity check matrix by placing an $(i \times (N-K)/L+j)^{th}$ column at an $((N-K)-(j+1) \times L+i)^{th}$ column to a $0^{th}$ column to an $(N-K-1)^{th}$ column of the parity sub-matrix and placing an $(i \times (N-K)/L+j)^{th}$ row at an $((N-K)-(j+1) \times L+i)^{th}$ row to a $0^{th}$ row to an $(N-K-1)^{th}$ row of the parity sub-matrix, where L is a vector length and is a divisor of N−K excluding 1 and N−K, $0 \leq i \leq L-1$, and $0 \leq j \leq (N-K)/L-1$.

* * * * *

UNITED STATES PATENT AND TRADEMARK OFFICE
CERTIFICATE OF CORRECTION

PATENT NO. : 8,312,344 B2
APPLICATION NO. : 12/633391
DATED : November 13, 2012
INVENTOR(S) : Se Ho Myung et al.

Page 1 of 1

It is certified that error appears in the above-identified patent and that said Letters Patent is hereby corrected as shown below:

Title Page, Item (75) Inventors:

"Jae-Yoei KIM" should be -- Jai-Yoel KIM --.

Signed and Sealed this
Ninth Day of April, 2013

Teresa Stanek Rea
*Acting Director of the United States Patent and Trademark Office*